United States Patent
Strode

(10) Patent No.: US 9,306,790 B1
(45) Date of Patent: Apr. 5, 2016

(54) MULTI-CHANNEL SIMULTANEOUS SAMPLING WITH A SINGLE ADC

(71) Applicant: Maxim Integrated Products, Inc., San Jose, CA (US)

(72) Inventor: Jonathan Strode, Los Altos, CA (US)

(73) Assignee: Maxim Integrated Products, Inc., San Jose, CA (US)

(*) Notice: Subject to any disclaimer, the term of this patent is extended or adjusted under 35 U.S.C. 154(b) by 0 days.

(21) Appl. No.: 14/554,699

(22) Filed: Nov. 26, 2014

Related U.S. Application Data

(60) Provisional application No. 62/006,376, filed on Jun. 2, 2014.

(51) Int. Cl.
*H04B 1/10* (2006.01)
*H04L 27/26* (2006.01)

(52) U.S. Cl.
CPC .................................. *H04L 27/2663* (2013.01)

(58) Field of Classification Search
CPC . H04L 1/0045; H04L 1/0003; H04L 27/0006; H04L 27/0012; H04L 27/1566; H04L 27/264; H04L 27/01; H04L 27/2647; G01S 15/8997; G01S 7/526; H04J 1/05; H04N 5/44
USPC .................................................. 375/343, 350
See application file for complete search history.

(56) References Cited

U.S. PATENT DOCUMENTS

| | | | | |
|---|---|---|---|---|
| 8,643,522 B2* | 2/2014 | Panigada et al. | | 341/141 |
| 2005/0117069 A1* | 6/2005 | McNeely | | 348/725 |
| 2008/0013654 A1* | 1/2008 | Rick et al. | | 375/345 |
| 2010/0098411 A1* | 4/2010 | Nakashima | | H04B 10/60 398/25 |
| 2011/0001646 A1* | 1/2011 | Koch | | 341/143 |
| 2013/0016798 A1* | 1/2013 | Velazquez et al. | | 375/340 |
| 2013/0080093 A1* | 3/2013 | Yang | | G01R 21/133 702/60 |
| 2014/0002286 A1* | 1/2014 | Bogner | | H03M 1/1225 341/122 |

\* cited by examiner

*Primary Examiner* — Don N Vo

(57) ABSTRACT

A system includes an analog to digital converter (ADC) that samples an analog input signal as received by a first channel of a plurality of channels, samples the analog input signal as received by at least a second channel of the plurality of channels, and outputs a plurality of digital samples including a first set and a second set of digital samples of the analog input signal corresponding to the first channel and the second channel, respectively. A filter receives the first and second sets of digital samples, up-samples each of the first and second sets of digital samples, filters the up-sampled first set of digital samples and the up-sampled second set of digital samples, and outputs a first digital output signal and at least a second digital output signal based on the filtered first set of digital samples and the filtered second set of digital samples, respectively.

17 Claims, 7 Drawing Sheets

MULTI-CHANNEL SIMULTANEOUS SAMPLING WITH A SINGLE ADC

CROSS-REFERENCE TO RELATED APPLICATIONS

This application claims the benefit of U.S. Provisional Application No. 62/006,376, filed on Jun. 2, 2014. The entire disclosure of the application referenced above is incorporated herein by reference.

FIELD

The present disclosure relates to systems and methods for performing multi-channel sampling in analog-to-digital converters.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, an example multi-channel analog-to-digital converter (ADC) 100 includes a single ADC (e.g., a successive approximation register, or SAR, ADC) 104 to convert an analog input signal 108 to a digital output signal 112. The analog input signal 108 is provided to a plurality of channels 116-1, 116-2, 116-3, . . . , and 116-n, referred to collectively as channels 116. Each of the channels 116 includes a corresponding one of input amplifiers 120-1, 120-2, 120-3, . . . , and 120-n, referred to collectively as input amplifiers 120, low pass filters (LPFs) 124-1, 124-2, 124-3, . . . , and 124-n, referred to collectively as LPFs 124, and analog track and hold (T/H) circuits 128-1, 128-2, 128-3, . . . , and 128-n, referred to collectively as T/H circuits 128. The T/H circuits 128 allow the analog input signal 108 (as amplified by the input amplifiers 120 and filtered by the LPFs 124) to be sampled simultaneously by the ADC 104 via multiplexer 132. A digital LPF 136 filters an output of the ADC 104 to generate the digital output signal 112.

SUMMARY

A system includes an analog to digital converter (ADC) that samples an analog input signal as received by a first channel of a plurality of channels, samples the analog input signal as received by at least a second channel of the plurality of channels, and outputs a plurality of digital samples including a first set of digital samples of the analog input signal corresponding to the first channel and a second set of digital samples of the analog input signal corresponding to the second channel. A filter receives the first set of digital samples and the second set of digital samples, up-samples each of the first set of digital samples and the second set of digital samples, filters the up-sampled first set of digital samples and the up-sampled second set of digital samples, and outputs a first digital output signal and at least a second digital output signal based on the filtered first set of digital samples and the filtered second set of digital samples, respectively.

A method includes, using an analog to digital converter (ADC), sampling an analog input signal as received by a first channel of a plurality of channels, sampling the analog input signal as received by at least a second channel of a plurality of channels, and outputting a plurality of digital samples including a first set of digital samples of the analog input signal corresponding to the first channel and a second set of digital samples of the analog input signal corresponding to the second channel. The method further includes up-sampling each of the first set of digital samples and the second set of digital samples, filtering the up-sampled first set of digital samples and the up-sampled second set of digital samples, and outputting a first digital output signal and at least a second digital output signal based on the filtered first set of digital samples and the filtered second set of digital samples, respectively.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
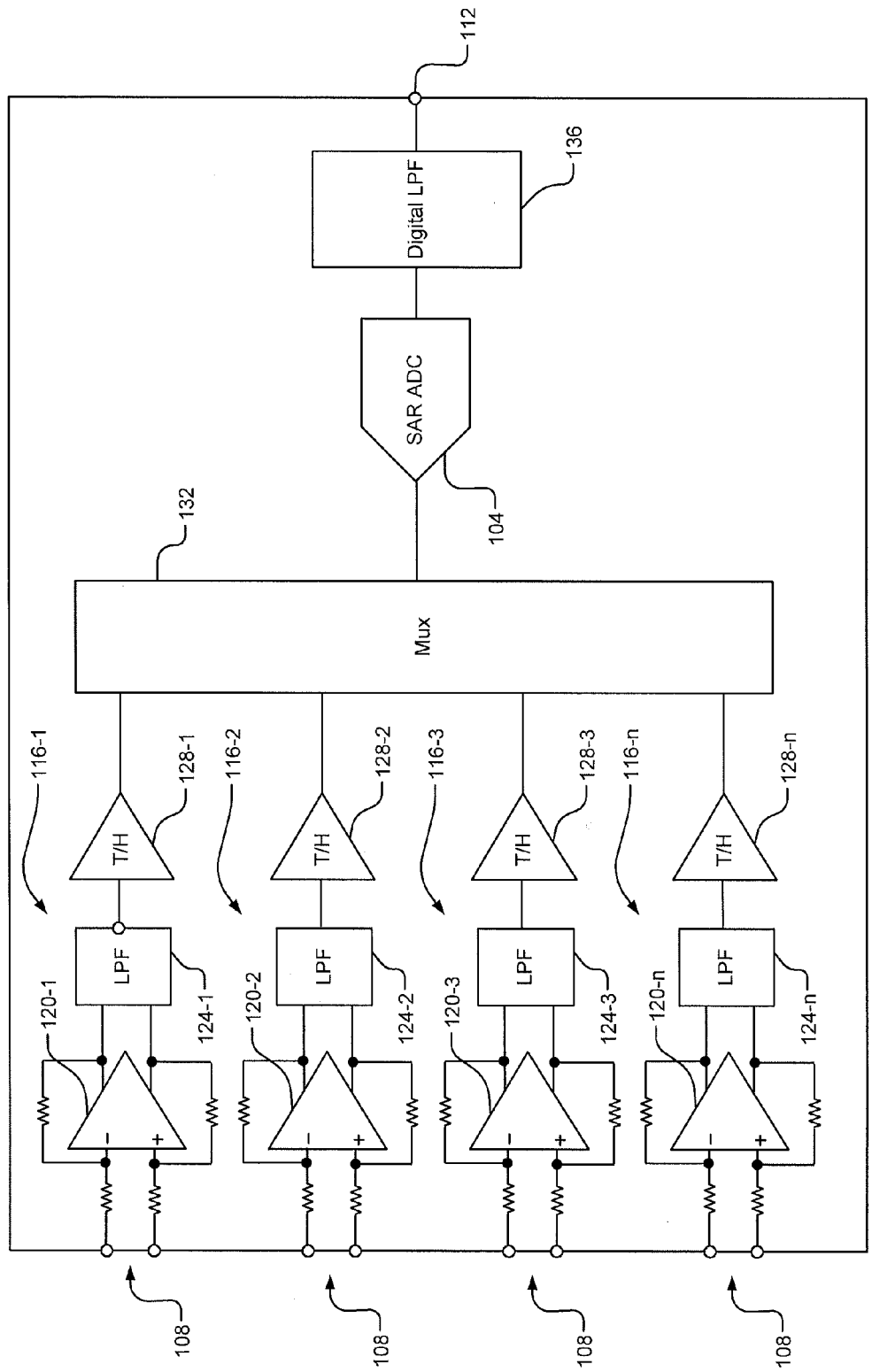
FIG. 1 is a functional block diagram of a multi-channel analog-to-digital converter including multiple track and hold circuits according to the prior art.

In a multi-channel analog-to-digital converter (ADC), analog track and hold (T/H) circuits increase cost and chip area associated with the ADC, and may introduce additional errors into conversion of an analog input signal into a digital output signal. An ADC according to the principles of the present disclosure eliminates the T/H circuits for multi-channel simultaneous sampling ADCs having more channels than ADCs. Accordingly, chip area is reduced, channel to channel gain and phase matching are improved, noise is reduced, and accurate programmable delays between channels are achieved without increasing the number of ADCs and without requiring multiple T/H circuits.

The ADC may eliminate the T/H circuits by implementing digital up-sampling and a decimation filter to restore missing sample time information into de-multiplexed ADC data.

Accordingly, a single ADC may be used for simultaneous sampling of the analog input signal on multiple channels without the need for multiple T/H circuits. Further, in addition to being able to maintain a same delay between the multiple channels, programmable delays can be used.

For example, in a multi-channel multiplexed ADC system according to the principles of the present disclosure, the ADC converts a sample of the signal from each channel in sequence, which causes a delay of one conversion period between each adjacent channel. However, the phases of the sampled signals can be recovered if the sample time is known. Missing sample time information may be restored by up-sampling the sampled signal. For example, in a four channel (e.g., channels A, B, C, and D) ADC system, the ADC may sequentially convert channels A, B, C, and D before returning to sample channel A. Accordingly, de-multiplexed ADC data for channel A may be [A1, A2, A3, . . . ]. Similarly, the de-multiplexed ADC data for channel B is [B1, B2, B3, . . . ], the de-multiplexed ADC data for channel C is [C1, C2, C3, . . . ], and the de-multiplexed ADC data for channel D is [D1, D2, D3, . . . ].

There is a one conversion period delay between the samples of adjacent channels (e.g., between A1 and B1, between B1 and C1, etc.). Accordingly, the samples are out of phase. The correct phase for the samples of each channel is restored by up-sampling the data. For example, the ADC data for channel A becomes [A1, 0, 0, 0, A2, 0, 0, 0, A3, 0, 0, 0, . . . ], the ADC for channel B becomes [0, B1, 0, 0, 0, B2, 0, 0, 0, B3, 0, 0, 0 . . . ], etc. In other words, the up-sampling inserts a "0" in place of each missing sample of the respective channels. This up-sampling results in images in the frequency domain that are filtered out with a low pass filter (LPF) according to the principles of the present disclosure. In other words, the digital output of the ADC is low pass filtered to reduce noise caused by the up-sampling as the signal bandwidth is lower than the ADC conversion rate. Further, a programmable (i.e., adjustable) delay may be added to any channel by shifting the data. For example, channel B could be shifted such that the ADC data for channel B corresponds to [0, 0, B1, 0, 0, 0, B2, 0, 0, 0, B3, 0, 0, 0, . . . ]. In some implementations, finer resolution than the ADC conversion period can be obtained by up-sampling to a higher data rate.

Figure 2:
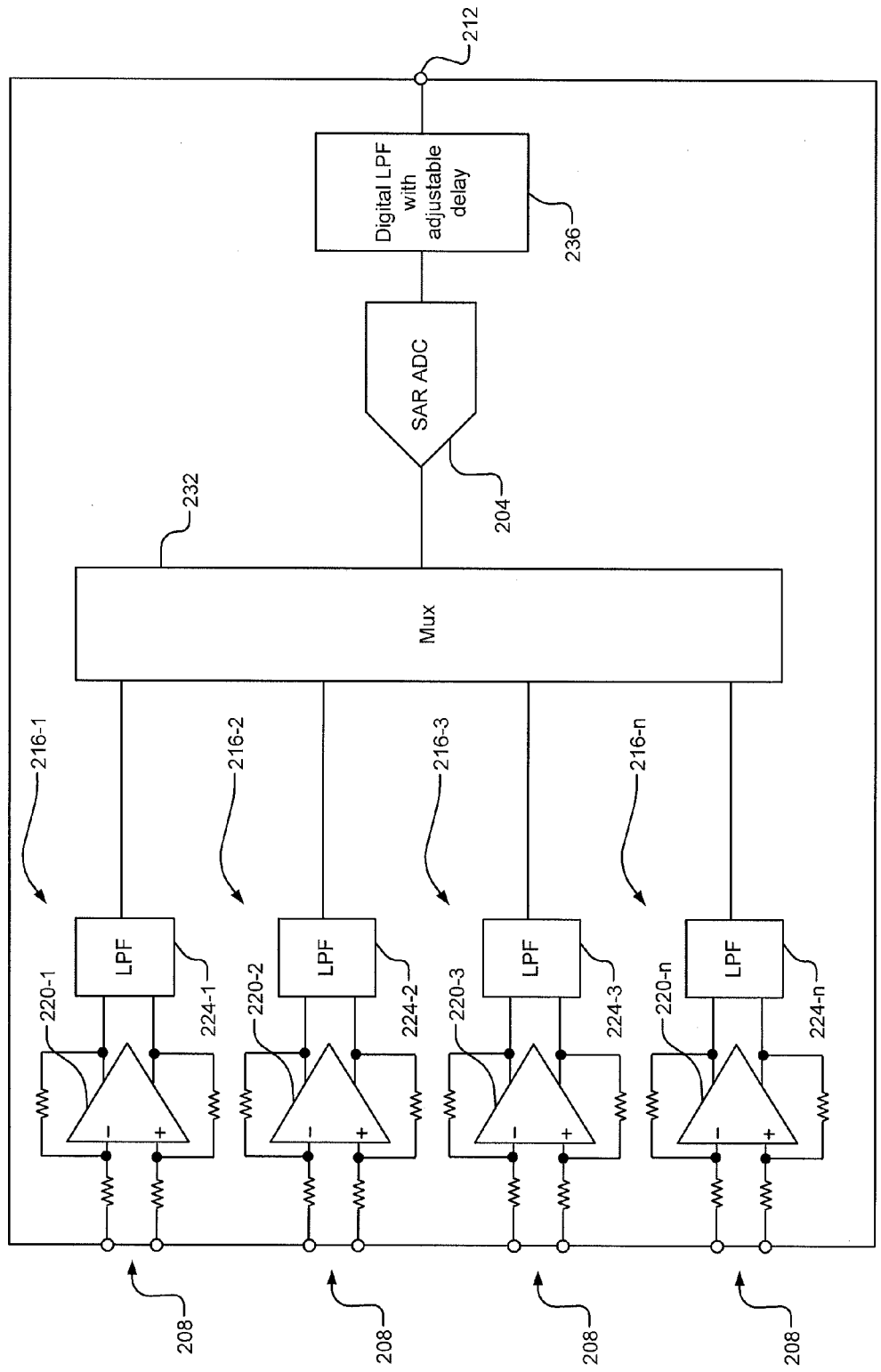
FIG. 2 is a functional block diagram of a multi-channel analog-to-digital converter according to the principles of the present disclosure.

Referring now to FIG. 2, an example multi-channel analog-to-digital converter (ADC) 200 according to the principles of the present disclosure includes an ADC (e.g., a successive approximation register, or SAR, ADC) 204 to convert an analog input signal 208 to a digital output signal 212. The analog input signal 208 is provided to a plurality of channels 216-1, 216-2, 216-3, . . . , and 216-n, referred to collectively as channels 216. Each of the channels 216 includes a corresponding one of input amplifiers 220-1, 220-2, 220-3, . . . , and 220-n, referred to collectively as input amplifiers 220, and low pass filters (LPFs) 224-1, 224-2, 224-3, . . . , and 224-n, referred to collectively as LPFs 224. The analog input signal 208 (as amplified by the input amplifiers 220 and filtered by the LPFs 224) is sequentially sampled by the ADC 204 via the respective channels 216 and a multiplexer 232.

A digital LPF 236 according to the principles of the present disclosure de-multiplexes the samples received from the ADC 204, performs up-sampling and low pass filtering on the samples, and decimates the samples. In some implementations, the LPF 236 may insert a programmable (adjustable) delay into the samples. In this manner, the LPF 236 filters an output of the ADC 204 to generate the digital output signal 212.

Figure 3:
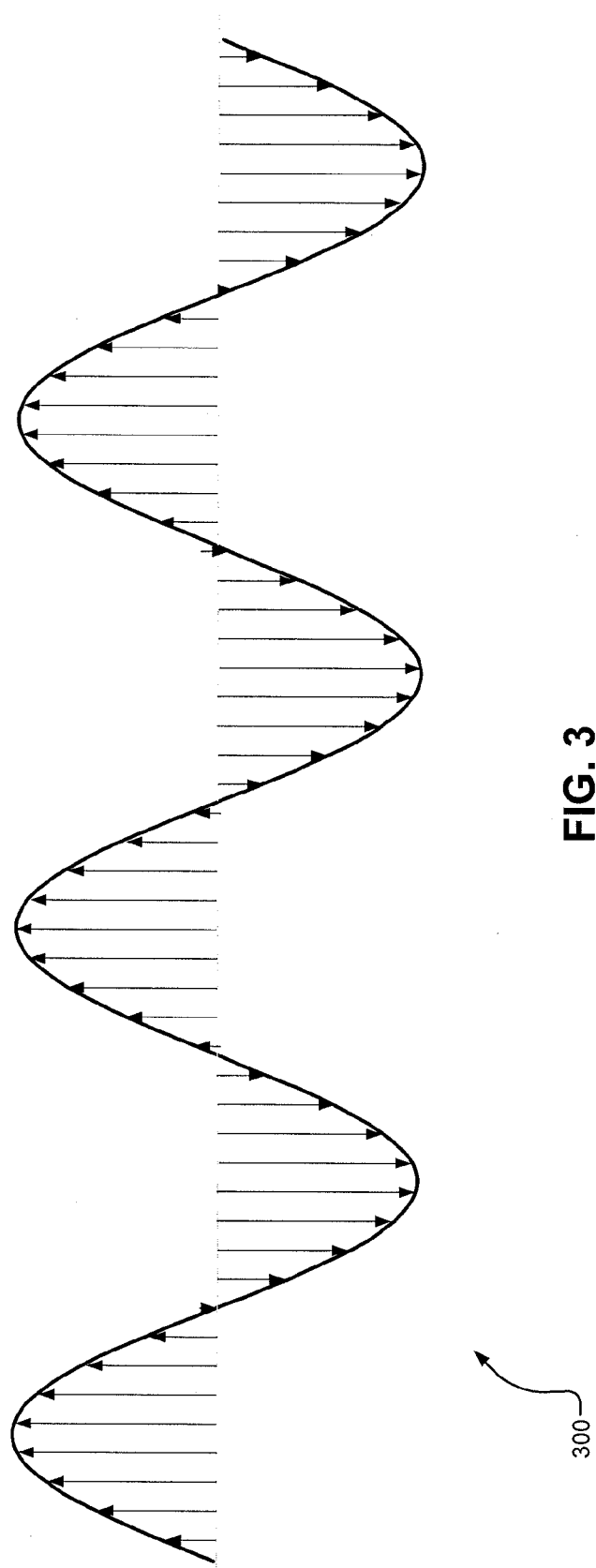
FIG. 3 illustrates an over-sampled sine wave according to the principles of the present disclosure.
Figure 4:
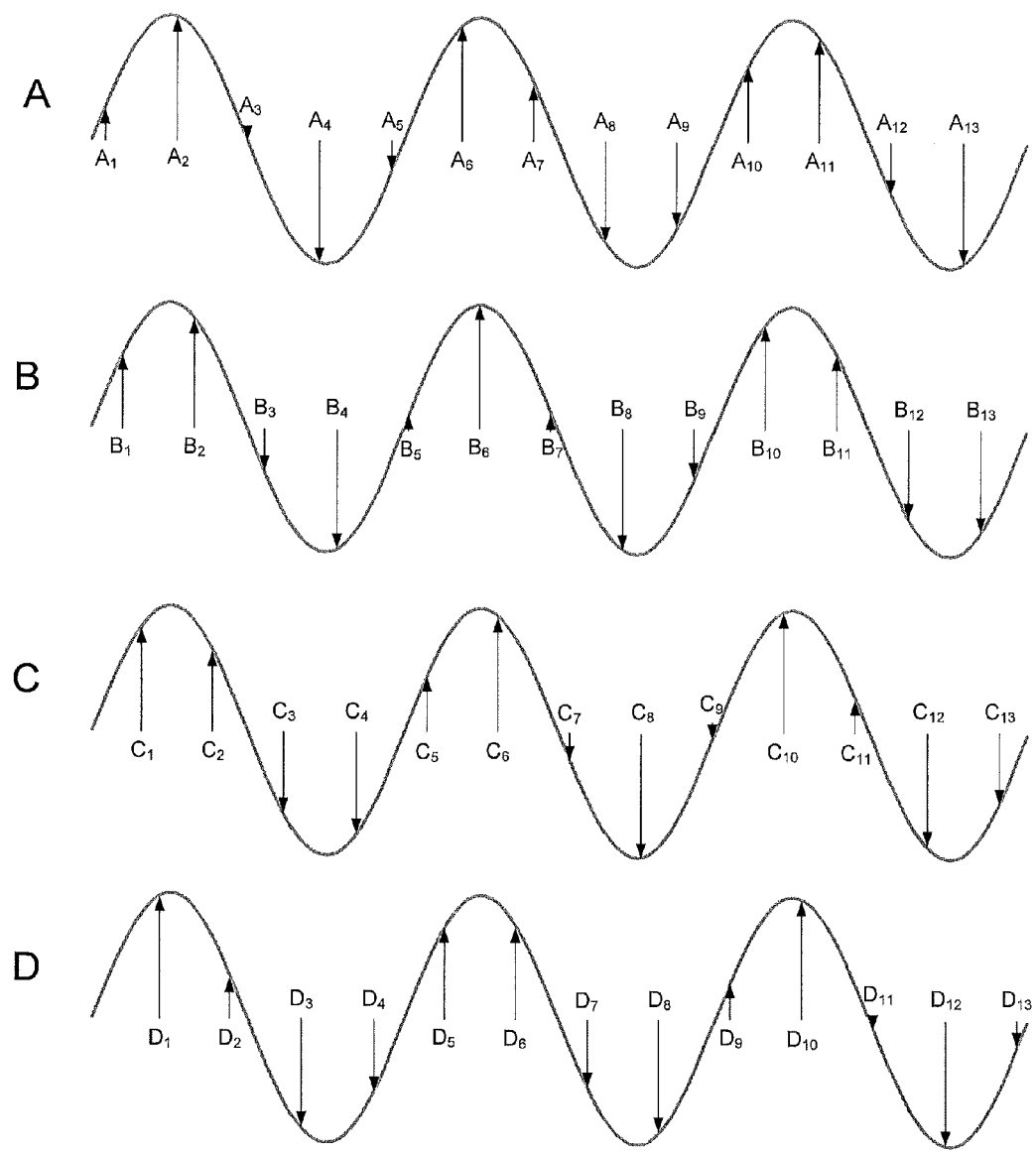
FIG. 4 illustrates samples of multiple channels with one clock delay between each channel according to the principles of the present disclosure.

Referring now to FIGS. 3 and 4, FIG. 3 is an example over-sampled sine wave 300. In other words, the sine wave 300 corresponds to an output of the ADC 204 if only a single one of the channels 216 is sampled instead of sequentially sampling each of the channels 216. Conversely, FIG. 4 illustrates example sine waves 400 resulting from sampling each of the channels 216 (e.g., corresponding to channels A, B, C, and D) sequentially with a delay (e.g., a delay of one clock pulse) between sampling adjacent ones of the channels 216. Accordingly, each of the channels 216 is sampled at ¼th of the rate that a single channel would be sampled to generate the sine wave 300. However, when the samples are combined (based on a known sampling time of each of the samples), the sine waves 400 correspond to the sine wave 300 (i.e., properties of the sine wave 300 are not changed).

For example, for each of the channels A-D as shown in FIG. 4, zeroes (0s) are provided between each of the samples for each channel (e.g., resulting in [A1, 0, 0, 0, A2, 0, 0, 0, A3, 0, 0, 0, . . . ], [0, B1, 0, 0, 0, B2, 0, 0, 0, B3, 0, 0, 0, . . . ], [0, 0, C1, 0, 0, 0, C2, 0, 0, 0, C3, 0, 0, 0, . . . ], and [0, 0, 0, D1, 0, 0, 0, D2, 0, 0, 0, D3, 0, 0, 0, . . . ]). When the samples for the four channels are combined, the result corresponds to [A1, B1, C1, D1, A2, B2, C2, D2, A3, B3, C3, D3, . . . ].

Figure 5:
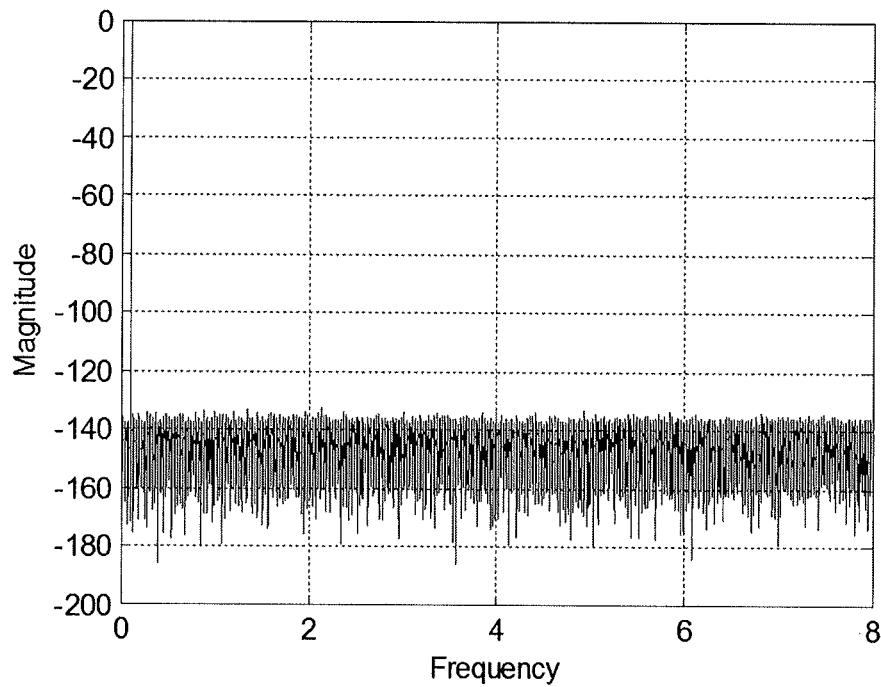
FIG. 5 illustrates a fast Fourier transform of an analog input signal according to the principles of the present disclosure.
Figure 6:
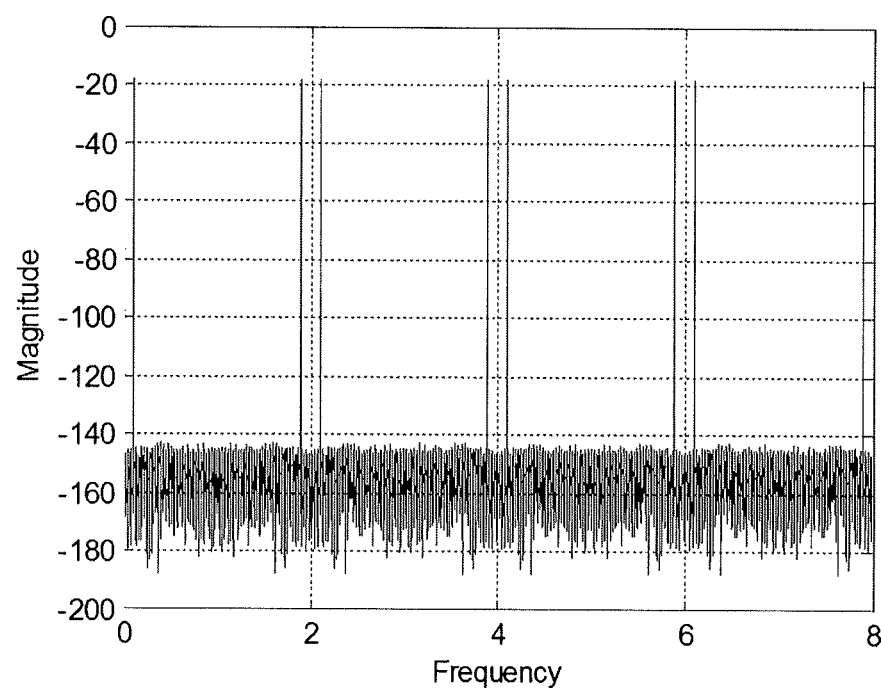
FIG. 6 illustrates a fast Fourier transform of one channel of the analog input signal after up-sampling according to the principles of the present disclosure.
Figure 7:
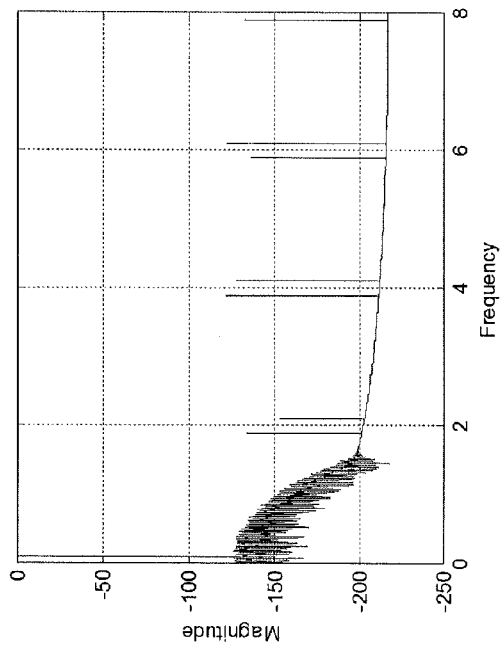
FIG. 7 illustrates a fast Fourier transform of the channel of FIG. 6 after low pass filtering according to the principles of the present disclosure.

FIG. 5 illustrates an example fast Fourier transform (FFT) of the original analog input signal 208. FIG. 6 illustrates an example FFT of one of the channels 216 (e.g., channel A, or 216-1) after up-sampling. FIG. 7 illustrates an FFT of the channel shown in FIG. 6 after digital low pass filtering.

Figure 8:
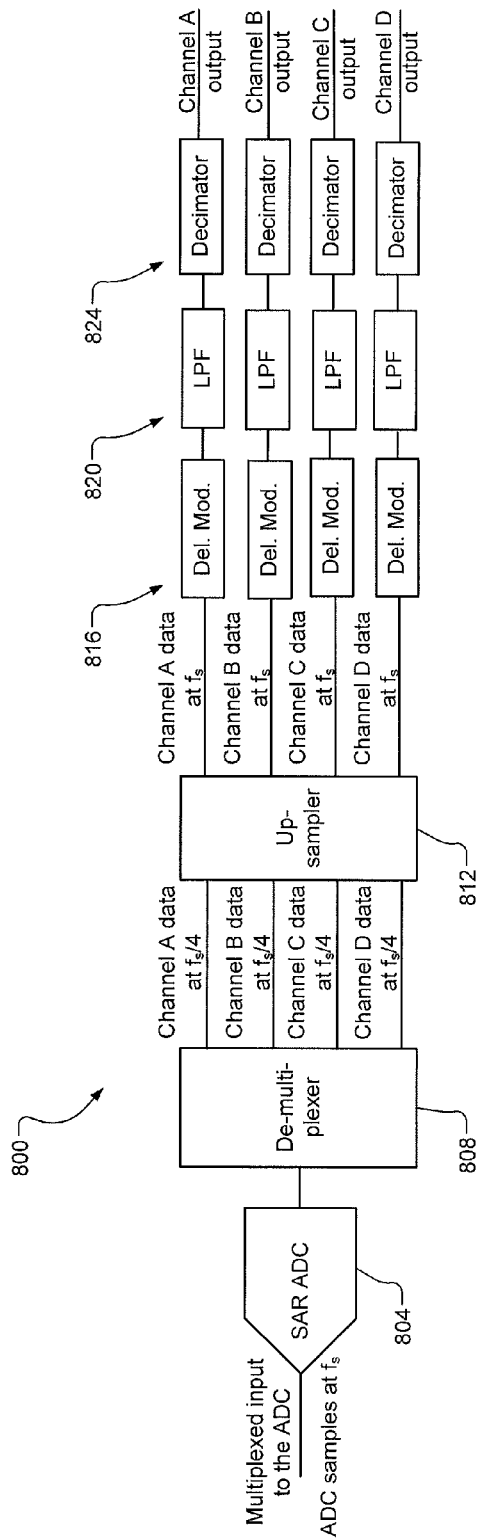
FIG. 8 is a functional block diagram of an example low pass filter according to the principles of the present disclosure.

Referring now to FIG. 8, an example LPF 800 is shown in more detail. An ADC 804 receives a multiplexed analog input signal (e.g., from the channels 216 via the multiplexer 232 as shown in FIG. 2) and samples the analog input signal at a frequency fs and outputs digital samples (e.g., A1, B1, C1, D1, A2, B2, C2, D2, A3, B3, C3, D3, . . . ) accordingly. The LPF 800 includes a de-multiplexer 808 that receives the digital samples and demultiplexes the digital samples into individual channels corresponding to channel A data (A1, A2, A3, . . . ), channel B data (B1, B2, B3, . . . ), channel C data (C1, C2, C3, . . . ) and channel D data (D1, D2, D3, . . . ). For example, each of the channel A, B, C, and D data corresponds to a sampling frequency of fs/4. An up-sampler 812 up-samples the data received from each of the channels to generate up-sampled data at the original conversion rate fs of the ADC 804 (e.g., by inserting zeroes between samples of the respective channels to achieve a sampling frequency of fs). In some implementations, the up-sampler 812 provides the up-sampled data at fs to delay modules 816 to selectively add a programmable delay between the channels. LPFs 820 filter the data from each of the channels, and decimators 824 decimate the data to generate digital outputs for each of the channels. In some implementations, the LPFs 820 and the decimators 824 may be combined into a single function.

Accordingly, the data from each channel is first interpolated and then decimated. This process can be extended by interpolating to a higher clock rate and thus enabling the delay of each channel to be adjusted by a finer amount than the conversion period. If the filtering is performed using an FIR filter, the associated digital processing is not affected because the inserted data points are zeroes and therefore add no additional processing. However, more filter coefficients may be stored.

Figure 9:
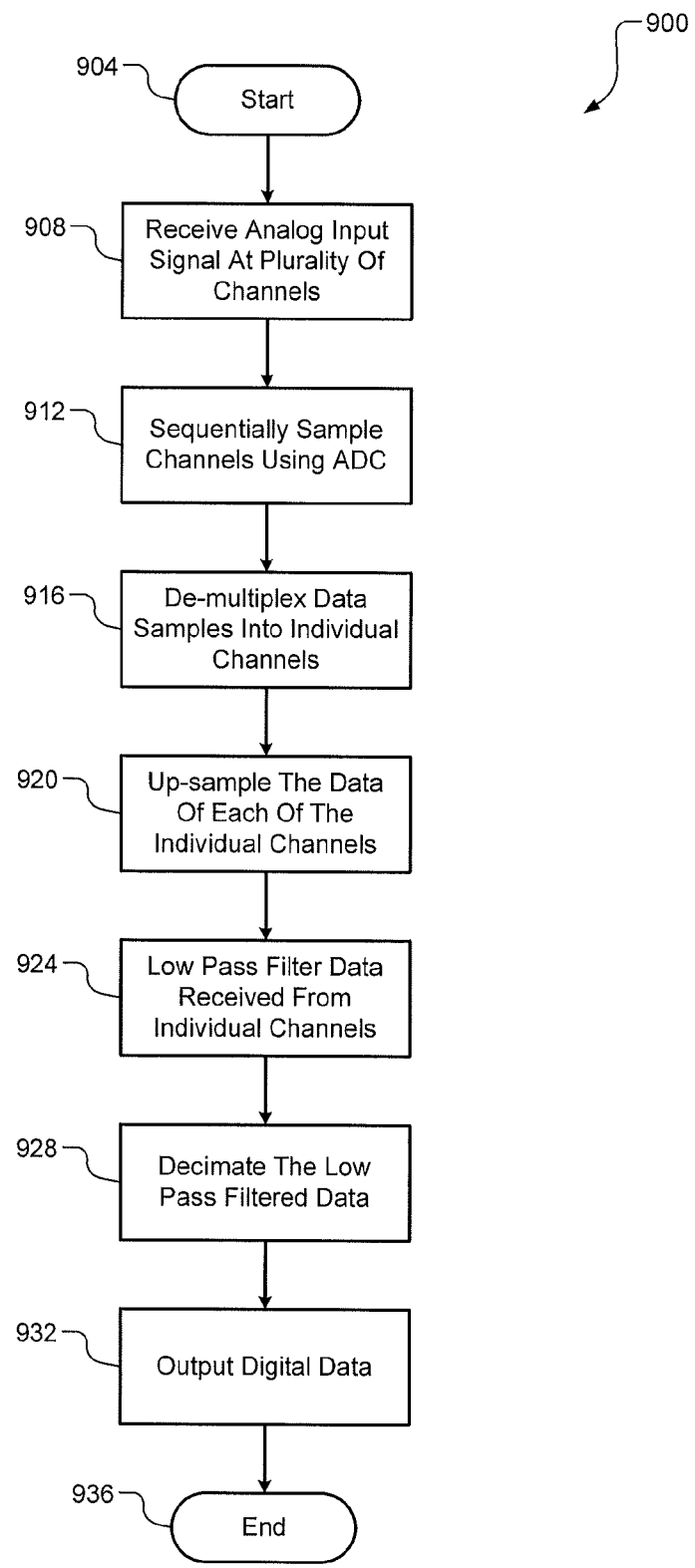
FIG. 9 illustrates steps of an example multi-channel ADC sampling method according to the principles of the present disclosure.

Referring now to FIG. 9, an example multi-channel ADC sampling method 900 starts at 904. For example, various components of the ADC 200 shown in FIG. 2 may perform steps of the method 900. At 908, an analog input signal is received at each of a plurality of channels. At 912, an ADC sequentially samples the channels at an overall sampling rate of fs to generate sampled digital data. For example, the ADC sequentially samples the channels, with a delay between samples of adjacent channels. Accordingly, each channel is individually sampled at a rate of fs/n, where n corresponds to a number (e.g., a total quantity) of the channels being sampled. At 916, the method 900 de-multiplexes the sampled data into individual channels (e.g., using a demultiplexer). At 920, the method 900 up-samples the data of each of the channels (e.g., using an up-sampler). For example, the method 900 inserts zeroes into the sampled data of each individual channel to achieve a sampling rate of fs for each channel. At 924, the method 900 low pass filters the sampled data (e.g., using a plurality of low pass filters corresponding to respective ones of the channels). At 928, the method 900 decimates the filtered data (e.g., using a plurality of decimators corresponding to respective ones of the channels). At 932, the method 900 outputs the digital data. The method ends at 936.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:
1. A system comprising:
a multiplexer that (i) receives an analog input signal on each of a first channel and a second channel of a plurality of channels, and (ii) selects between the first channel and the second channel to output the analog input signal;
an analog to digital converter (ADC) that samples the analog input signal as received from the multiplexer and outputs a plurality of digital samples including (i) a first set of digital samples of the analog input signal corre- sponding to the first channel and (ii) a second set of digital samples of the analog input signal corresponding to the second channel;

a demultiplexer that demultiplexes the plurality of digital samples output by the ADC into the first set of digital samples of the analog input signal corresponding to the first channel and the second set of digital samples of the analog input signal corresponding to the second channel; and a filter that receives the first set of digital samples and the second set of digital samples from the demultiplexer, up-samples each of the first set of digital samples and the second set of digital samples, filters the up-sampled first set of digital samples and the up-sampled second set of digital samples, and outputs a first digital output signal and at least a second digital output signal based on the filtered first set of digital samples and the filtered second set of digital samples, respectively.

2. The system of claim 1, wherein the ADC includes a successive approximation register (SAR) ADC.

3. The system of claim 1, wherein the plurality of channels includes a plurality of input amplifiers that receive the analog input signal.

4. The system of claim 1, wherein the plurality of channels include a plurality of low pass filters that receive the analog input signal.

5. The system of claim 1, wherein the filter inserts a first delay into the first set of digital samples and a second delay into the second set of digital samples.

6. The system of claim 5, wherein the filter adjusts at least one of the first delay and the second delay to align the first set of digital samples with the second set of digital samples.

7. The system of claim 1, wherein the ADC samples the analog input signal as received by the first channel and the second channel at a sampling frequency that is less than a sampling frequency of the ADC.

8. The system of claim 7, wherein the ADC samples the analog input signal as received by the first channel and the second channel at a sampling frequency of fs/n, where fs is the sampling frequency of the ADC and n is a number of the plurality of channels.

9. The system of claim 7, wherein the filter up-samples each of the first set of digital samples and the second set of digital samples to the sampling frequency of the ADC.

10. The system of claim 7, wherein, to up-sample each of the first set of digital samples and the second set of digital samples, the filter inserts at least one zero between samples of each of the first set of digital samples and the second set of digital samples.

11. The system of claim 1, wherein the filter includes a first delay module and a second delay module that respectively delay the first set of digital samples and the second set of digital samples.

12. The system of claim 1, wherein the filter includes a first low pass filter and a second low pass filter that respectively filter the up-sampled first set of digital samples and the up-sampled second set of digital samples.

13. The system of claim 1, wherein the filter includes a first decimator and a second decimator that respectively decimate the filtered first set of digital samples and the filtered second set of digital samples.

14. A method comprising:
receiving an analog input signal on each of a first channel and a second channel of a plurality of channels;
selecting, using a multiplexer, between the first channel and the second channel to output the analog input signal;
using an analog to digital converter (ADC),
sampling the analog input signal as received from the multiplexer, and
outputting a plurality of digital samples including (i) a first set of digital samples of the analog input signal corresponding to the first channel and (ii) a second set of digital samples of the analog input signal corresponding to the second channel;
demultiplexing the plurality of digital samples output by the ADC into the first set of digital samples of the analog input signal corresponding to the first channel and the second set of digital samples of the analog input signal corresponding to the second channel;
up-sampling each of the first set of digital samples and the second set of digital samples;
filtering the up-sampled first set of digital samples and the up-sampled second set of digital samples; and
outputting a first digital output signal and at least a second digital output signal based on the filtered first set of digital samples and the filtered second set of digital samples, respectively.

15. The method of claim 14, further comprising:
inserting a first delay into the first set of digital samples and a second delay into the second set of digital samples; and
selectively adjusting at least one of the first delay and the second delay to align the first set of digital samples with the second set of digital samples.

16. The method of claim 14, wherein sampling the analog input signal as received by the first channel and the second channel includes sampling the analog input signal at the first channel and the second channel at a sampling frequency that is less than a sampling frequency of the ADC.

17. The method of claim 16, wherein sampling the analog input signal as received by the first channel and the second channel includes sampling the analog input signal at the first channel and the second channel at a sampling frequency of fs/n, where fs is the sampling frequency of the ADC and n is a number of the plurality of channels.

* * * * *

UNITED STATES PATENT AND TRADEMARK OFFICE
CERTIFICATE OF CORRECTION

Page 1 of 2

PATENT NO. : 9,306,790 B1
APPLICATION NO. : 14/554699
DATED : April 5, 2016
INVENTOR(S) : Jonathan Strode It is certified that error appears in the above-identified patent and that said Letters Patent is hereby corrected as shown below:

In the Specification:

| | |
|---|---|
| Column 3, Line 17 | Delete "[A1, A2, A3,...]." and insert --[$A_1$, $A_2$, $A_3$,...].-- |
| Column 3, Line 18 | Delete "[B1, B2, B3,...]," and insert --[$B_1$, $B_2$, $B_3$,...],-- |
| Column 3, Line 19-20 | Delete "[C1, C2, C3,...]," and insert --[$C_1$, $C_2$, $C_3$,...],-- |
| Column 3, Line 21 | Delete "[D1, D2, D3,...]." and insert --[$D_1$, $D_2$, $D_3$,...].-- |
| Column 3, Line 23-24 | Delete "A1 and B1, between B1 and C1," and insert --$A_1$ and $B_1$, between $B_1$ and $C_1$,-- |
| Column 3, Line 27-28 | Delete "[A1, 0, 0, 0, A2, 0, 0, 0, A3, 0, 0, 0,...]," and insert --[$A_1$, 0, 0, 0, $A_2$, 0, 0, 0, $A_3$, 0, 0, 0,...],-- |
| Column 3, Line 28-29 | Delete "[0, B1, 0, 0, 0, B2, 0, 0, 0, B3, 0, 0, 0...]," and insert --[0, $B_1$, 0, 0, 0, $B_2$, 0, 0, 0, $B_3$, 0, 0, 0...],-- |
| Column 3, Line 40 | Delete "[0, 0, B1, 0, 0, 0, B2, 0, 0, 0, B3, 0, 0, 0,...]." and insert --[0, 0, $B_1$, 0, 0, 0, $B_2$, 0, 0, 0, $B_3$, 0, 0, 0,...].-- |
| Column 4, Line 16-19 | Delete "[A1, 0, 0, 0, A2, 0, 0, 0, A3, 0, 0, 0,...], [0, B1, 0, 0, 0, B2, 0, 0, 0, B3, 0, 0, 0,...], [0, 0, C1, 0, 0, 0, C2, 0, 0, 0, C3, 0, 0, 0,...], and [0, 0, 0, D1, 0, 0, 0, D2, 0, 0, 0, D3, 0, 0, 0,...])." and insert --[$A_1$, 0, 0, 0, $A_2$, 0, 0, 0, $A_3$, 0, 0, 0,...], [0, $B_1$, 0, 0, 0, $B_2$, 0, 0, 0, $B_3$, 0, 0, 0,...], [0, 0, $C_1$, 0, 0, 0, $C_2$, 0, 0, 0, $C_3$, 0, 0, 0,...], and [0, 0, 0, $D_1$, 0, 0, 0, $D_2$, 0, 0, 0, $D_3$, 0, 0, 0,...]).-- |
| Column 4, Line 20-21 | Delete "[A1, B1, C1, D1, A2, B2, C2, D2, A3, B3, C3, D3,...]." and insert --[$A_1$, $B_1$, $C_1$, $D_1$, $A_2$, $B_2$, $C_2$, $D_2$, $A_3$, $B_3$, $C_3$, $D_3$,...].-- |
| Column 4, Line 31 | Delete "fs" and insert --$f_s$-- |
| Column 4, Line 31-32 | Delete "(e.g., A1, B1, C1, D1, A2, B2, C2, D2, A3, B3, C3, D3,....)" and insert --(e.g., $A_1$, $B_1$, $C_1$, $D_1$, $A_2$, $B_2$, $C_2$, $D_2$, $A_3$, $B_3$, $C_3$, $D_3$,...)-- |
| Column 4, Line 35-36 | Delete "(A1, A2, A3,...)," and insert --($A_1$, $A_2$, $A_3$,...),-- |
| Column 4, Line 36 | Delete "(B1, B2, B3,...)," and insert --($B_1$, $B_2$, $B_3$,...),-- |
| Column 4, Line 37 | Delete "(C1, C2, C3,...)" and insert --($C_1$, $C_2$, $C_3$,...)-- |
| Column 4, Line 37 | Delete "(D1, D2, D3,....)." and insert --($D_1$, $D_2$, $D_3$,...).-- |

Signed and Sealed this
Ninth Day of August, 2016

Michelle K. Lee
*Director of the United States Patent and Trademark Office*

CERTIFICATE OF CORRECTION (continued)
U.S. Pat. No. 9,306,790 B1

In the Specification:

| | |
|---|---|
| Column 4, Line 39 | Delete "fs/4." and insert --$f_s$/4.-- |
| Column 4, Line 41 | Delete "fs" and insert --$f_s$-- |
| Column 4, Line 43 | Delete "fs)." and insert --$f_s$).-- |
| Column 4, Line 66 | Delete "fs" and insert --$f_s$-- |
| Column 5, Line 2 | Delete "fs/n," and insert --$f_s$/n,-- |
| Column 5, Line 9 | Delete "fs" and insert --$f_s$-- |

In the Claims:

| | |
|---|---|
| Column 7, Claim 8, Line 39 | Delete "fs/n, where fs" and insert --$f_s$/n, where $f_s$-- |
| Column 8, Claim 17, Line 50 | Delete "fs/n, where fs" and insert --$f_s$/n, where $f_s$-- |